(12) United States Patent
van Driest

(10) Patent No.: US 6,314,145 B1
(45) Date of Patent: Nov. 6, 2001

(54) TRACKING CARRIER TIMING

(75) Inventor: Hans van Driest, Bilthoven (NL)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/168,145

(22) Filed: Oct. 7, 1998

(30) Foreign Application Priority Data

Jun. 30, 1998 (EP) .................................................. 98305166

(51) Int. Cl.[7] .................................................. H04L 27/14
(52) U.S. Cl. .................. 375/326; 375/344; 375/354; 375/371; 455/164.1
(58) Field of Search .................................. 375/326, 344, 375/354, 371; 370/516; 455/164.1, 173.1, 181.1, 259, 265

(56) References Cited

U.S. PATENT DOCUMENTS

| | | | |
|---|---|---|---|
| 5,282,228 | 1/1994 | Scott et al. | 375/97 |
| 5,285,480 | * 2/1994 | Chennakeshu et al. | 375/101 |
| 5,579,346 | 11/1996 | Kanzaki | 375/344 |
| 5,710,792 | * 1/1998 | Fukawa et al. | 375/229 |
| 6,151,368 | * 11/2000 | Cochran | 375/326 |

FOREIGN PATENT DOCUMENTS

| | | | |
|---|---|---|---|
| 0726662A | 8/1996 | (EP) | H04L/7/033 |
| WO97/44931 | 11/1997 | (EP) | H04L/7/04 |

OTHER PUBLICATIONS

"VLSI Implementation of Synchronization Algorithms in A 100 Mbit/s Digital Receiver", by Martin Oerder and Heinrich Meyr, IEEE, New York, Dec. 1990, pp. 589–593.

* cited by examiner

Primary Examiner—Mohammad H. Ghayour
(74) Attorney, Agent, or Firm—Julio A. Garceran

(57) ABSTRACT

The timing of a carrier signal is tracked in a receiver. The receiver receives a signal produced by a transmitter having a single frequency source which is used to generate a reference clock frequency and a carrier signal frequency, there being a fixed, predetermined relationship between the reference and carrier frequencies. In the receiver there is a single frequency source which is used to generate a reference clock frequency and a carrier reference signal frequency, there being a fixed, predetermined relationship between the reference and carrier reference frequencies. The fixed, predetermined relationship in the transmitter and the receiver is the same.

8 Claims, 3 Drawing Sheets

TRACKING CARRIER TIMING

CROSS-REFERENCE TO RELATED APPLICATION

This application claims priority of European Patent Application No. 97308743.0, filed Oct. 7, 1997.

FIELD OF THE INVENTION

The present invention relates to the tracking of carrier timing in a receiver in which a single frequency source is used to generate a reference clock and to generate a carrier signal. The invention particularly relates to transceivers in which part of the functionality takes place in discrete time.

BACKGROUND OF THE INVENTION

In most modern transceivers, for both technical and cost reasons a single frequency reference is used for the reference clock and the carrier oscillator in the transmitter, and a single frequency reference is used for the reference clock and the carrier reference in the receiver. The carrier oscillator and the carrier reference are respectively generated by multiplying the respective frequency reference by a predetermined value.

In the transmitter the reference clock is used as a sample clock in the modulator and in the digital-to-analogue converter, and in the receiver the reference clock is used in the analogue-to-digital converter and in digital signal processing circuitry (including the demodulator).

In such transceiver designs, in which part of the functionality takes place in discrete time, it is required to synchronise the sample timing of the receiver with the sample timing of the transmitter, i.e. synchronise the reference clock of the receiver with that of the transmitter. There are known techniques to derive sample tracking out of the received signal. However, such known techniques require complex circuitry in the receiver to ensure timing tracking of the carrier.

A method is usually provided in the receiver to synchronise the receiver with the carrier on which the received signal is modulated. This synchronisation involves determining, and removing, the error between the carrier frequency of the transmitter and the reference carrier frequency in the receiver. Especially in coherent detection receivers, the receiver must be very rigidly synchronised, or locked, to the received carrier.

SUMMARY OF THE INVENTION

It is an object of the present invention to simplify the circuitry required in the receiver for timing tracking of the receive reference clock to the transmit reference clock by utilising circuitry provided in the receiver for synchronising the receiver to the carrier.

According to the present invention there is provided circuitry for receiving a transmitted signal, the transmitted signal comprising a modulated signal generated under the control of a transmit timing signal of a first predetermined frequency and up-converted by a carrier frequency at a multiple n of the first predetermined frequency, the circuitry comprising: a signal source for generating a receiver timing signal of a second predetermined frequency; a frequency multiplier having a multiply ratio of n and connected to receive as an input the receiver timing signal and for generating a carrier reference signal having a reference frequency of a multiple n of the second predetermined frequency; a down-converter connected to receive as a first input the transmitted signal and as a second input the carrier reference signal, and for generating at an output an offset modulated signal corresponding to the modulated signal offset by a frequency equal to the difference between the carrier frequency and the reference frequency, a frequency compensator connected to receive as an input the offset modulated signal and for generating at an output a difference signal having a frequency corresponding to the difference between the carrier frequency and the reference frequency; a frequency divider, having a divide ratio of n, connected to receive the difference signal and to generate at an output thereof an error signal having a frequency equal to the difference between the first and second predetermined frequencies; timing control means, connected to receive the error signal and for generating at least one timing control signal in dependence on the error signal; and timing adjustment means coupled to the output of the down-converter, and for adjusting the time phase of the output of the down-converter responsive to said at least one timing control signal.

The present invention thus provides a technique for timing tracking in which error information normally generated for carrier frequency tracking is also used to track the reference timing of the receiver relative to the transmitter in dependence on a known ratio between the transmitter carrier frequency and the transmitter reference timing.

In a preferred embodiment there is provided offset removal circuitry connected between the down-converter and the timing adjustment means for removing the offset from the offset modulated signal and having a first input connected to the output of the down-converter and a second input connected to the output of the frequency compensator, and for generating at an output thereof the modulated signal. Thus in a preferred embodiment the invention advantageously utilises an efficient and economic circuit for carrier tracking.

In a further preferred embodiment the timing control means includes comparison means for comparing the error signal to a predetermined error value, wherein the at least one timing control signal is generated in dependence on the error signal being greater than the predetermined error value. Thus in a further preferred embodiment the invention advantageously enables the timing of the modulated signal to be adjusted in the receiver only if the reference timing in the receiver is in error by greater than a predetermined amount.

The present invention also provides a method of tracking the carrier timing of a transmitted signal in a receiver, the transmitted signal comprising a modulated signal generated under the control of a transmit timing signal of a first predetermined frequency and up-converted by a carrier frequency at a multiple n of the first predetermined frequency, the method comprising: receiving the transmitted signal; generating a receiver timing signal of a second predetermined frequency; generating a carrier reference signal having a reference frequency of a multiple n of the second predetermined frequency; down-converting the transmitted signal by mixing it with the carrier reference signal, thereby generating an offset modulated signal corresponding to the modulated signal offset by a frequency equal to the difference between the carrier frequency and the reference frequency; generating a difference signal having a frequency corresponding to the difference between the carrier frequency and the reference frequency; dividing the difference signal by n, thereby generating an error signal having a frequency equal to the difference between the first and second predetermined frequencies; generating at least one timing control signal in dependence on the error signal;

and adjusting the time phase of the down-converted signal responsive to said at least one timing control signal.

In a further aspect, the present invention provides a communication system, including a transmitter comprising: a signal source for generating a transmitter timing signal of a first predetermined frequency; a frequency multiplier having a multiply ratio of n and connected to receive as an input the transmitter timing signal and for generating a carrier signal having a frequency of a multiple n of the first predetermined frequency; and an up-converter connected to receive as a first input a modulated signal to be transmitted and as a second input the carrier signal, and for generating at an output a transmit signal; the communication system further including a receiver comprising: a signal source for generating a receiver timing signal of a second predetermined frequency; a frequency multiplier having a multiply ratio of n and connected to receive as an input the receiver timing signal and for generating a carrier reference signal having a reference frequency of a multiple n of the second predetermined frequency; a down-converter connected to receive as a first input the transmitted signal and as a second input the carrier reference signal, and for generating at an output an offset modulated signal corresponding to the modulated signal offset by a frequency equal to the difference between the carrier frequency and the reference frequency, a frequency compensator connected to receive as an input the offset modulated signal and for generating at an output a difference signal having a frequency corresponding to the difference between the carrier frequency and the reference frequency; a frequency divider, having a divide ratio of n, connected to receive the difference signal and to generate at an output thereof an error signal having a frequency equal to the difference between the first and second predetermined frequencies; timing control means, connected to receive the error signal and for generating at least one timing control signal in dependence on the error signal; timing adjustment means coupled to the output the down-converter, and for adjusting the time phase of the output of the down-converter responsive to said at least one timing control signal.

BRIEF DESCRIPTION OF THE DRAWINGS

The invention will now be described by way of an example with reference to the accompanying drawings in which.

DETAILED DESCRIPTION OF PREFERRED EMBODIMENT

Figure 1:
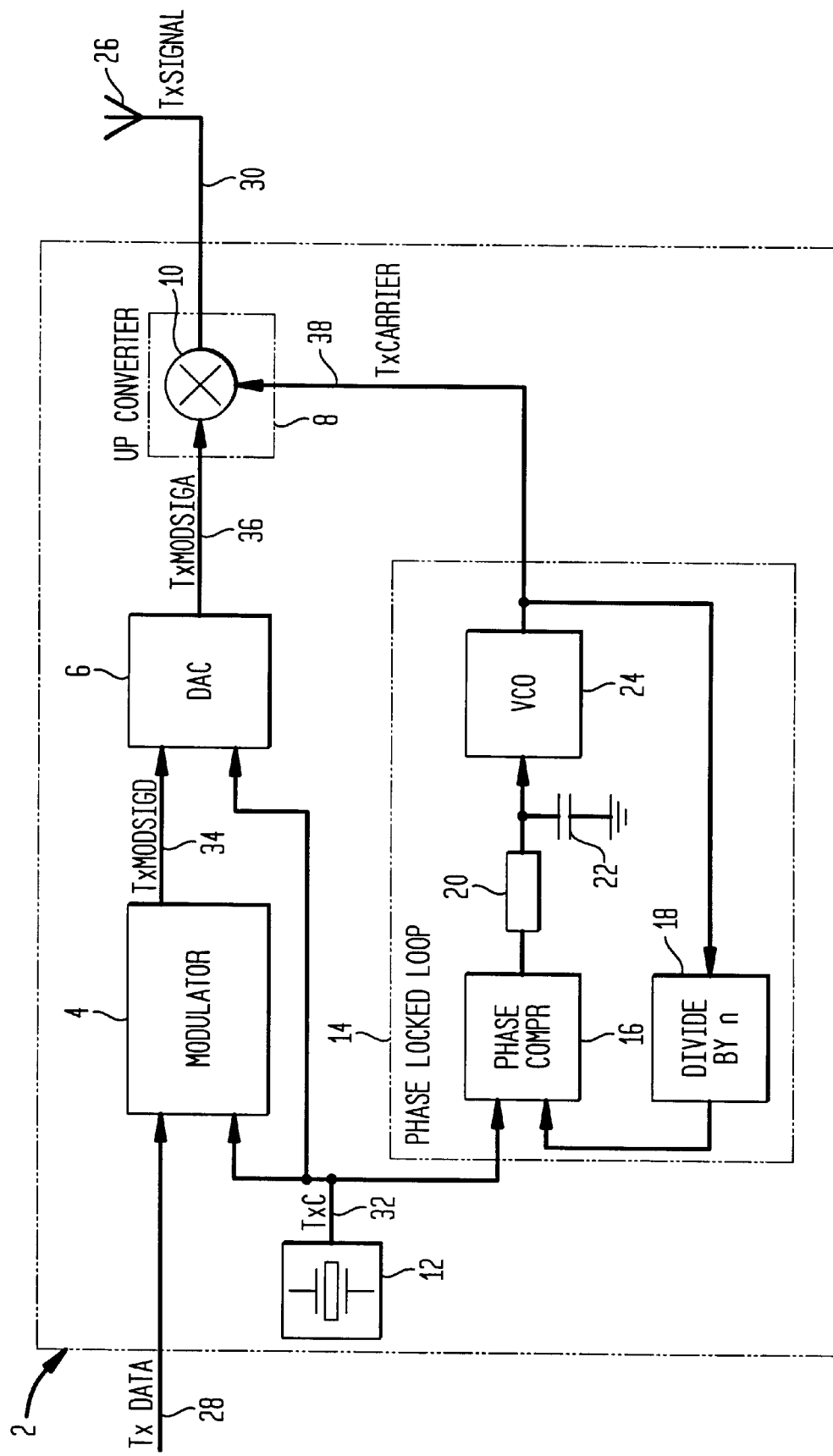
FIG. 1 is a block schematic diagram of a simple transmitter.

Referring to FIG. 1, there is illustrated a simple transmitter circuit designated generally as 2. The transmitter circuit 2 includes a modulator 4, a digital-to-analogue converter (DAC) 6, an up-converter 8, an oscillator 12 and a phase locked loop (PLL) 14. The transmitter circuit 2 receives digital data to be transmitted TXDATA on line 28 and outputs a signal for transmission, TXSIGNAL on line 30, to an antenna 26.

The oscillator 12 generates a sample clock from which a transmit clock TXC on line 32 is derived. The transmit clock TXC is at a first predetermined frequency and forms an input to each of the modulator 4, the DAC 6 and the PLL 14. The present invention may be utilised with any known modulation technique. The modulation technique used does not effect the implementation of the inventive concept. The modulator 4 also receives the data to be transmitted TXDATA on line 28 and modulates the data, in accordance with known techniques, and produces a modulated digital data signal to be transmitted TXMODSIGD on a signal line 34 which is input to the DAC 6 and converted into an analogue modulated signal to be transmitted TXMODSIGA on line 36 at the output of the DAC 6. The transmit clock TXC controls the sampling in the modulator 4 and the sampling in the DAC 6.

The up-converter 8, which includes a mixer 10, converts the modulated analogue data signal TXMODSIGA on line 36 to a frequency which is suitable for transmission by the antenna 26. For this purpose, the PLL 14 is provided to act as a frequency multiplier and provide a carrier signal TXCARRIER on line 38 to the up-converter 8, the frequency of which is a multiple of the frequency of the transmit clock TXC on line 32.

The PLL 14 includes a phase comparator 16, a loop filter comprised of a resistor 20 and capacitor 22, a voltage controlled oscillator (VCO) 24, and a divider 18. These components are interconnected in a manner well-known to a skilled person to comprise a frequency multiplier. The multiplying ratio of the PLL 14 is determined by the divider ratio n of the divider 18. Thus the carrier signal TXCARRIER on line 38 at the output of the PLL has a frequency which is n times the frequency of the transmit clock TXC at the input to the PLL.

The up-converter 8 receives the analogue modulated signal TXMODSIGA at a first input to the mixer 10 and the carrier signal TXCARRIER at a second input to the mixer 10, and up-converts the analogue modulated signal TXMODSIGA on line 36 to the carrier frequency of the carrier signal TXCARRIER on line 38. The up-converted signal thus generated on line 30 at the output of the mixer 10 is input to the antenna 26 and transmitted as the signal TXSIGNAL.

Figure 2:
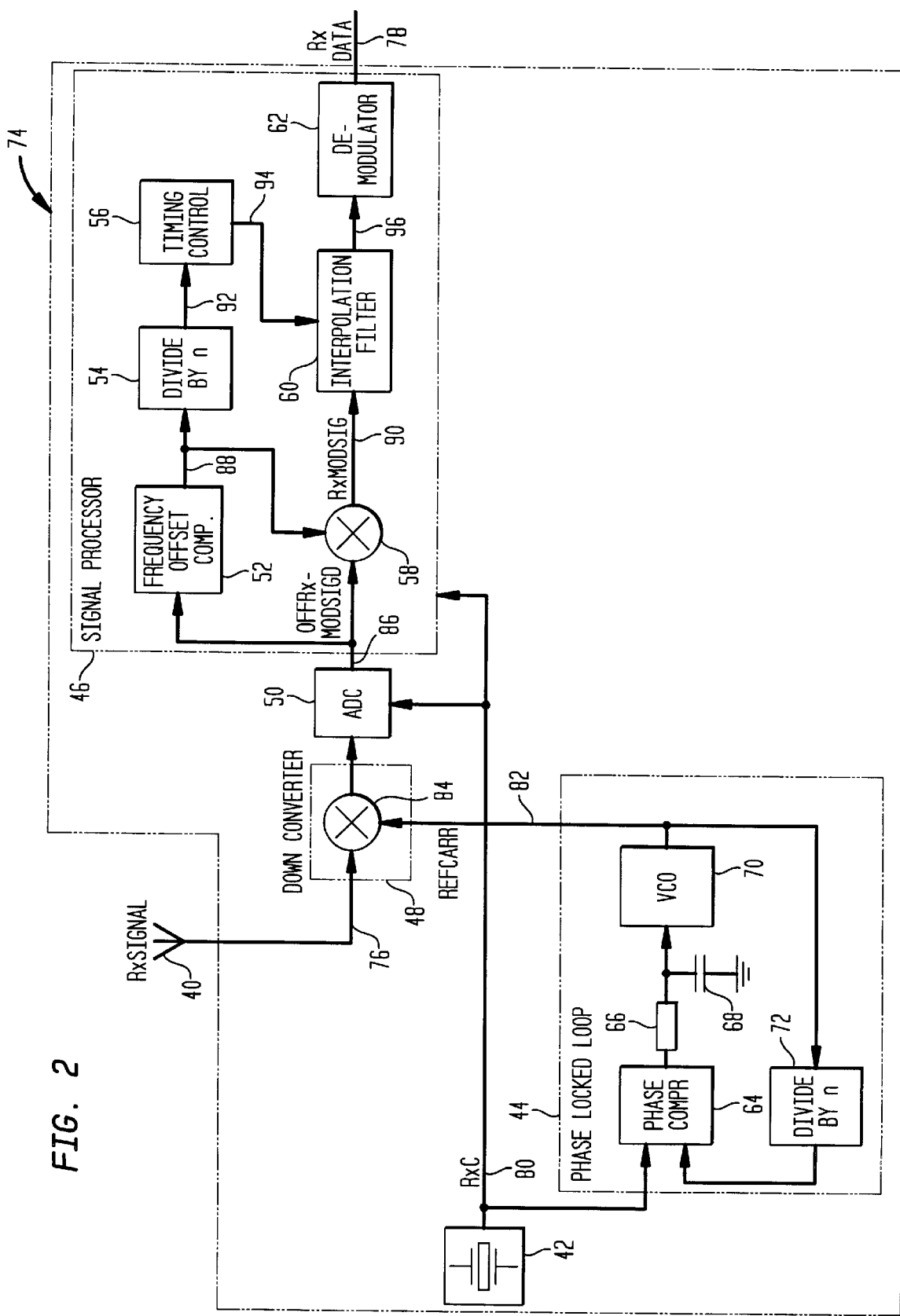
FIG. 2 is a block schematic diagram of a receiver according to the invention.

Referring to FIG. 2, there is illustrated an exemplary receiver circuit according to the present invention for receiving a signal transmitted by the transmitter circuit of FIG. 1, designated generally as 74. The receiver circuit 74 includes a signal processor 46, a down-converter 48, an analogue-to-digital converter (ADC) 50, an oscillator 42 and a phase locked loop (PLL) 44. The receiver circuit 74 receives a signal RXSIGNAL via an antenna 40 on line 76, and outputs a received, demodulated digital data signal RXDATA on line 78.

The oscillator 42 generates a sample clock from which a receive clock RXC on line 80 is derived. The receive clock RXC is at a second predeterminned frequency and forms an input to the signal processor 46, the ALC 50 and the PLL 44. The PLL 44 of the receiver circuit is constructed identically to the PLL 14 of the transmitter circuit and includes a phase comparator 64, a loop filter comprised of a resistor 66 and capacitor 68, a voltage controlled oscillator (VCO) 70, and a divider 72. As in the transmitter, these components are interconnected to provide a frequency multiplier, the multiplying ratio of which is determined by the divider ratio of the divider 72. In accordance with the present invention, the divider 72 has a divider ratio of n equal to the divider ratio n of the divider 18 of the PLL 14 in the transmitter circuit. Consequently, the PLL 44 multiplies the receive clock signal RXC by the factor n in the same manner as the PLL 14 multiplies the transmit clock signal TXC by the factor n. Thus, the PLL 44 provides a signal at its output on line 82 having a frequency of n times the frequency of the receive clock signal RXC.

The signal at the output of the PLL on line 82 forms the carrier reference signal REFCARR for the receiver 74 which is used, as described hereinafter, to down-convert the signal received at the antenna 40 for processing in the receiver.

The down-converter 48 down-converts the signal received at the antenna 40. The down-converter 48, which includes a mixer 84, receives as a first input to the mixer 84 the received signal RXSIGNAL on line 76 and as a second input to the mixer 84 the carrier reference signal REFCARR on line 82, and generates an output to the ADC 50 which is a result of mixing its two respective inputs.

The purpose of the down-converter 84 is to perform the opposite operation of the up-converter 8 of the transmitter and remove the carrier frequency from the signal RXSIGNAL received at the antenna 40. If the frequency and phase of the signal supplied by the PLL 44 on line 82 to the down-converter 48 is identical to the frequency and phase of the signal supplied by the PLL 14 on line 38 to the up-converter 8, then the frequency and phase of the signal at the output of the down-converter 48 will correspond directly to the frequency and phase of the analogue modulated signal TXMODSIGA on the input line 36 to the up-converter 8.

However, the transmitter and receiver circuit each have independent oscillators, 12 and 42 respectively, and a discrepancy between the frequency and phase of such exists. Thus the output of the down-converter 84 is a signal OFFRXMODSIGA which comprises the analogue modulated signal RXMODSIGA contained in the received signal RXSIGNAL offset by a signal having a frequency corresponding to the difference between the frequency of the signal generated by the PLL 14 and the frequency of the signal generated by the PLL 44. This signal OFFRXMODSIGA is converted by the ADC 50 into a digital signal OFFRXMODSIGD on line 86.

The signal on line 86 forms an input to the signal processor 46 which includes a frequency offset compensator circuit 52, a divider 54, a timing control circuit 56, a multiplier 58, an interpolation filter 60 and a demodulator 62. The output of the signal processor 46 forms the output received data signal of the receiver RXDATA on line 78. The elements of the signal processor additionally receive the receive clock signal RXC on line 80, although the specific connection to the elements is not shown in FIG. 2.

The signal on line 86 forms an input to the frequency offset compensator of the signal processor 46. The frequency offset compensator includes a circuit to measure the frequency offset of the signal OFFRXMODSIGD output by the ADC on line 86, i.e. the difference between the frequency of the signal generated by the PLL 14 and the frequency of the signal generated by the PLL 44.

The output of the circuit to measure the frequency offset is used to generate a rotating vector signal having a frequency of rotation equal to the measured frequency error. The rotating vector signal is output from the frequency offset compensator 52 on line 88.

Figure 3:
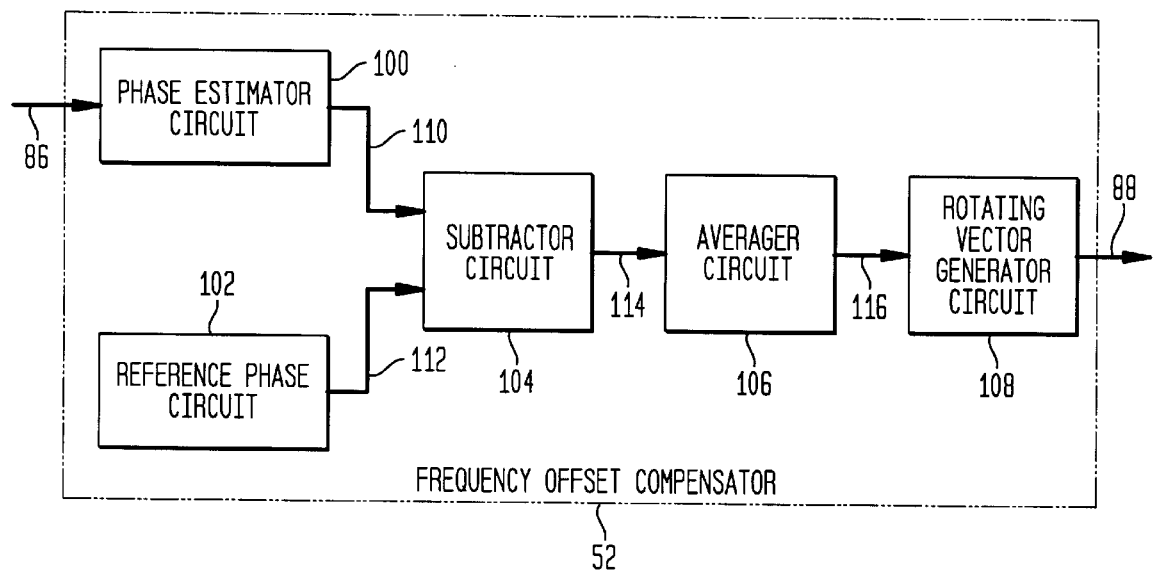
FIG. 3 illustrates a schematic drawing of an exemplary frequency offset compensator used in an embodiment of the receiver of FIG. 2.

Referring to FIG. 3, there is shown a schematic drawing of one example of a frequency offset compensator 52. The implementation of the frequency offset compensator 52 is dependent upon the modulation method used for the transmitted signal. The frequency offset compensator 52 is described hereafter, for the purpose of illustration, for a phase modulation method applied in the transmitter. Such phase modulation may, for example, be binary phase shift keying (BPSK). The implementation of the frequency offset compensator 52 will be within the scope of one skilled in the art in accordance with the modulation technique used. An example for BPSK modulation is presented here for completeness, the implementation being outside the scope of the invention and within the scope of the skilled person.

The frequency offset compensator 52 includes a phase estimator circuit 100, a reference phase circuit 102, a subtractor circuit 104, an averager circuit 106, and a rotating vector generator circuit 108.

The phase estimator circuit 100 receives as an input the signal OFFRXMODSIGD at the input to the frequency offset compensator on line 86. The phase estimator circuit 100 estimates (measures) the phase of the incoming signal on line 86 for each symbol. The estimated phase error for each symbol is subtracted from the estimated phase error for the preceding symbol to produce an estimated phase difference for two successive symbols. The estimated phase difference thus represents an estimate of the phase difference between the current received symbol of the incoming signal and the immediately preceding symbol. The estimated phase difference is output by the phase estimator circuit 100 on line 110.

For BPSK the phase differences between successive incoming symbols can be either 0 or 180 degrees, and these two possible phase differences are stored as reference phases in the reference phase circuit 102. The estimated phase difference of the incoming signal is output by the phase estimator circuit on line 110, and the reference phase stored in the reference phase circuit is output on line 112. The subtractor circuit 104 receives the estimated phase difference on line 110 and the reference phase on line 112 and subtracts one from the other, delivering a signal at its output on line 114 representing the phase error.

The averager circuit receives the signal at the output of the subtractor circuit 104 and averages the phase error over multiple received symbols to derive a better estimate of the average phase error.

Finally, the averager circuit 106 outputs the averaged phase error to the rotating vector generator circuit 108, which uses the averaged phase error to construct a rotating vector signal having the frequency of rotation equal to the phase error.

The multiplier 58 receives as a first input the output signal OFFRXMODSIGD of the ADC 50 on line 86 and as a second input the output of the frequency offset compensator 52 on line 88, and multiplies these two inputs together to produce an output on line 90. As the multiplier 58 multiplies the signal on line 86 comprising the analogue modulated signal RXMODSIGD offset by a signal having a frequency corresponding to the difference between the frequencies of the signals generated by the PLLs 14 and 44, and the signal on line 88 has a rotation frequency equal to the measured frequency offset, the output of the multiplier 58 produces a signal corresponding to the analogue modulated signal RXMODSIGD on line 90. Thus, the multiplier 58 effectively removes the frequency offset from the signal output from the down-converter 48 and generates the digital modulated signal RXMODSIGD on line 90 carried in the signal RXSIGNAL received in the antenna 40.

The signal RXMODSIGD on line 90 is thus ready for demodulation to retrieve the modulated data. However, in order to correctly demodulate this signal, it is necessary to synchronise the timing of the receive clock signal RXC to the transmit clock signal under the control of which the data was modulated. This is achieved, in accordance with the present invention, by provision of the divider 54 and timing control circuitry 56.

The divider 54 receives the rotating vector at the output of the frequency offset compensator 52 on line 88. The divider 54 has a divider ratio of n, equal to the divider ratio of n in both the divider 18 of the PLL 14 of the transmitter and the divider 72 of the PLL 44 of the receiver. Thus the divider 54 provides an output signal on line 92 which has a frequency corresponding to the frequency difference between the transmit clock signal TXC and the receive clock signal RXC i.e the difference between the first and second predetermined frequencies.

As in both the transmitter and the receiver the respective transmit and receive clock signals TXC and RXC are used to sample the signals in the modulator 4 and the signal processor 46 respectively, the signal on line 92 having a frequency corresponding to the frequency difference between the transmit and receive clock signals TXC and RXC can be used to determine the error of the sample frequency in the receiver, i.e. the frequency of the receive clock RSC, relative to the sample frequency in the transmitter, i.e. the frequency of the transmit clock TXC.

The signal on line 92 forms an input to the timing control circuitry 56. The timing control circuitry uses the error of the sample frequency in the receiver, i.e. the error in the receive clock frequency RXC compared to the transmit clock frequency TXC, to determine the sample clock phase error in the receiver. That is, the error signal between the receive and transmit clock frequencies, or the deviation of the receive and transmit clocks, is the controlling signal. If the error of the sample clock in the receiver gets too high, a timing control signal is generated on line 94.

The timing control signal on line 94 forms an input to the interpolation filter which also receives as an input the modulated signal RXMODSIGD at the output of the multiplier 58 on line 90. Responsive to the timing control signal on line 94, the interpolation filter time shifts the signal on line 90 to compensate for the timing drift between the transmitter and receiver sample clocks. The time shifted modulated signal is output on line 96.

Figure 4:
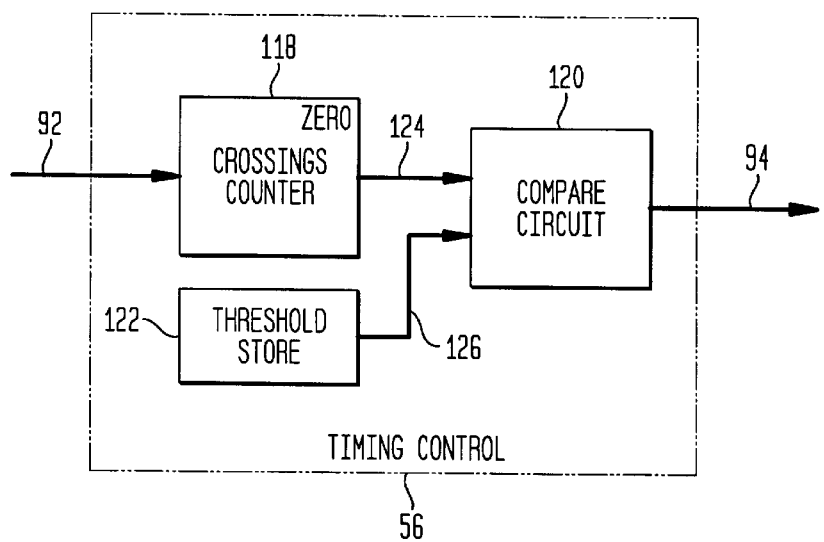
FIG. 4 illustrates a schematic drawing of an exemplary timing control circuit used in an embodiment of the receiver of FIG. 2.

There are many ways that the timing control circuitry 56 may be implemented, and many ways to generate the timing control signal 94 from the signal 92. One way of generating the timing control signal 94 is described hereinafter with reference to FIG. 4 which illustrates an exemplary implementation of the timing control circuitry 56 in the example of BPSK modulation discussed hereinabove.

The timing control circuitry includes a zero crossings counter 118, a threshold store 122 and a compare circuit 120. The zero crossings counter 118 receives the signal on line 92 and counts the zero crossings of the error of the sample clock. The number of zero crossings is output on line 124 to the compare circuit 120, which also receives a preset threshold value on line 126 from the threshold store 122. The preset threshold value determines by how much the receive clock RXC must drift away from the transmit clock TXC before timing adjustment is initiated. In a preferred implementation this value is set at 5%.

When the preset threshold value is exceeded, the compare circuit 120 sets the timing control signal on line 94 to initiate operation of the interpolation filter 60. The interpolation filter shifts the received samples such that when the actual time shift, or drift, between the receive clock RX and the transmit clock TXC is 5%, at the output of the interpolation filter on line 96 the drift appears to be 0%.

The interpolation filter 60 is a well-known filter which can be readily implemented by one skilled in the art. The interpolation filter may have a finite impulse response (FIR) structure in which the taps of the filter are initially such that the filter gives a time shift of the demodulated signal of zero. When the timing control signal on line 94 is set, the taps of the interpolation filter are recalculated, such that the filter gives a time shift in accordance with the value determined by the threshold value in the timing control circuitry 56. Recalculation of the taps can be performed using the Lagrange interpolation function, which is general known art.

It will be understood by one skilled in the art that a more advanced implementation of the timing control circuitry 94 could generate a plurality of timing control signals 94. The timing control circuitry may store a number of threshold values such that the timing compensation provided by the interpolation filter 60 is varied in accordance with the detected timing error.

The time shifted modulated signal on line 96 is presented to the demodulator 62 as an input, and the demodulator demodulates the signal by applying the appropriate techniques in accordance with the modulation techniques applied in the modulator 4, and outputs the received data signal RXDATA on line 78 of the receiver.

It will be appreciated that the specific implementation of the receiver circuit 74 may vary without departing from the scope of the invention. For example, the analogue-to-digital converter 50 and the mixer 58 for removing the offset may be connected at the output of the interpolation filter 60.

What is claimed is:

1. Circuitry for receiving a transmitted signal, the transmitted signal comprising a modulated signal (TXMODSIGA) generated under the control of a transmit timing signal (TXC) of a first predetermined frequency and up-converted by a carrier frequency at a multiple n of the first predetermined frequency, the circuitry comprising:

a signal source (42) for generating a receiver timing signal (RXC) of a second predetermined frequency;

a frequency multiplier (44) having a multiply ratio of n and connected to receive as an input the receiver timing signal (RXC) and for generating a carrier reference signal (REFCARRIER) having a reference frequency of a multiple n of the second predetermined frequency;

a down-converter (48) connected to receive as a first input the transmitted signal and as a second input the carrier reference signal (REFCARRIER), and for generating at an output an offset modulated signal (OFFRXMODSIGD) corresponding to the modulated signal (TXMODSIGA) offset by a frequency equal to the difference between the carrier frequency and the reference frequency, a frequency compensator (52) connected to receive as an input the offset modulated signal (OFFRXMODSIGD) and for generating at an output a difference signal having a frequency corresponding to the difference between the carrier frequency and the reference frequency;

a frequency divider (54), having a divide ratio of n, connected to receive the difference signal and to generate at an output thereof an error signal having a frequency equal to the difference between the first and second predetermined frequencies;

timing control means (56), connected to receive the error signal and for generating at least one timing control signal in dependence on the error signal;

timing adjustment means (60) coupled to the output of the down-converter (48), and for adjusting the time phase of the output of the down-converter (48) responsive to said at least one timing control signal.

2. Circuitry according to claim 1 further comprising: offset removal circuitry connected between the down-converter and the timing adjustment means for removing the offset from the offset modulated signal (OFFRXMODSIG) and having a first input connected to the output of the down-converter and a second input connected to the output of the frequency compensator, and for generating at an output thereof the modulated signal.

3. Circuitry according to claim 1 in which the timing control means includes comparison means for comparing the error signal to a predetermined error value, wherein the at least one timing control signal is generated in dependence on the error signal being greater than the predetermined error value.

4. Circuitry according to claim 1 further comprising:
an analogue-to-digital converter coupled to the output of the down-converter and responsive to the receiver timing signal, wherein the output of the down-converter is a digital signal.

5. A method of tracking carrier timing of a transmitted signal in a receiver, the transmitted signal comprising a modulated signal (TXMODSIGA) generated under the control of a transmit timing signal (TXC) of a first predetermined frequency and up-converted by a carrier frequency at a multiple n of the first predetermined frequency, the method comprising:
  receiving the transmitted signal;
  generating a receiver timing signal (RXC) of a second predetermined frequency;
  generating a carrier reference signal (REFCARRIER) having a reference frequency of a multiple n of the second predetermined frequency;
  down-converting the transmitted signal by mixing it with the carrier reference signal (REFCARRIER), thereby generating an offset modulated signal (OFFRXMODSIGD) corresponding to the modulated signal offset by a frequency equal to the difference between the carrier frequency and the reference frequency;
  generating a difference signal having a frequency corresponding to the difference between the carrier frequency and the reference frequency;
  dividing the difference signal by n, thereby generating an error signal having a frequency equal to the difference between the first and second predetermined frequencies;
  generating at least one timing control signal in dependence on the error signal; and
  adjusting the time phase of the down-converted signal responsive to said at least one timing signal.

6. The method of claim 5, further comprising the step of removing the offset from the offset modulated signal (OFFRXMODSIG).

7. The method of claim 5 further comprising the step of comparing the error signal to a predetermined error value, wherein the at least one timing signal is generated in dependence on the error signal being greater than the predetermined error value.

8. A communication system, including a transmitter comprising:
  a signal source (12) for generating a transmitter timing signal (TXC) of a first predetermined frequency;
  a frequency multiplier (14) having a multiply ratio of n and connected to receive as an input the transmitter timing signal (TXC) and for generating a carrier signal (TXCARRIER) having a frequency of a multiple n of the first predetermined frequency; and
  an up-converter (48) connected to receive as a first input a modulated signal to be transmitted and as a second input the carrier signal (TXCARRIER), and for generating at an output a transmit signal (TXSIGNAL);
the communication system further including a receiver comprising:
  a signal source (42) for generating a receiver timing signal (RXC) of a second predetermined frequency;
  a frequency multiplier (44) having a multiply ratio of n and connected to receive as an input the receiver timing signal (RXC) and for generating a carrier reference signal (REFCARRIER) having a reference frequency of a multiple n of the second predetermined frequency;
  a down-converter (48) connected to receive as a first input the transmitted signal and as a second input the carrier reference signal (REFCARRIER), and for generating at an output an offset modulated signal (OFFRXMODSIGD) corresponding to the modulated signal (TXMODSIGA) offset by a frequency equal to the difference between the carrier frequency and the reference frequency,
  a frequency compensator (52) connected to receive as an input the offset modulated signal (OFFRXMODSIGD) and for generating at an output a difference signal having a frequency corresponding to the difference between the carrier frequency and the reference frequency;
  a frequency divider (54), having a divide ratio of n, connected to receive the difference signal and to generate at an output thereof an error signal having a frequency equal to the difference between the first and second predetermined frequencies;
  timing control means (56), connected to receive the error signal and for generating at least one timing control signal in dependence on the error signal;
  timing adjustment means (60) coupled to the output the down-converter (48), and for adjusting the time phase of the output of the down-converter (48) responsive to said at least one timing control signal.

* * * * *